US006646526B2

(12) United States Patent
Kinayman et al.

(10) Patent No.: US 6,646,526 B2
(45) Date of Patent: Nov. 11, 2003

(54) SURFACE MOUNTABLE MICROWAVE FILTER CONFIGURATION AND METHOD OF FABRICATING SAME

(75) Inventors: Noyan Kinayman, Malden, MA (US); Eswarappa Channabasappa, Nashua, NH (US); Allan Buckle, Kenilworth (GB); Nitin Jain, San Diego, CA (US)

(73) Assignee: M/A-Com, Inc., Lowell, MA (US)

( * ) Notice: Subject to any disclaimer, the term of this patent is extended or adjusted under 35 U.S.C. 154(b) by 0 days.

(21) Appl. No.: 10/099,008

(22) Filed: Mar. 14, 2002

(65) Prior Publication Data

US 2003/0174032 A1 Sep. 18, 2003

(51) Int. Cl.[7] .............................. H01P 1/00; H01P 1/16; H03H 5/00

(52) U.S. Cl. ..................... 333/248; 333/251; 333/21 R; 333/26

(58) Field of Search ................................ 333/248, 251, 333/21 R, 26, 128, 202

(56) References Cited

U.S. PATENT DOCUMENTS 4,260,964 A * 4/1981 Saul ............................ 333/26
4,596,047 A * 6/1986 Watanabe et al. ........... 455/281
4,800,349 A * 1/1989 Gurcan et al. .............. 333/208
4,990,870 A * 2/1991 Reindel ....................... 333/208
5,162,760 A 11/1992 Phillips et al. .............. 333/206
5,218,373 A * 6/1993 Heckaman et al. ......... 343/786
5,640,134 A 6/1997 Ralph ......................... 333/202
6,057,747 A 5/2000 Takenoshita et al. ....... 333/137
6,060,967 A 5/2000 Asada ........................ 333/202
6,064,283 A 5/2000 Asada ........................ 333/202
6,064,350 A 5/2000 Uchimura et al. .......... 343/786
6,087,907 A 7/2000 Jain ............................ 333/26
6,150,197 A 11/2000 Boles ......................... 438/128

* cited by examiner

*Primary Examiner*—Patricia Nguyen

(57) ABSTRACT

A surface-mountable millimeter-wave waveguide filter is constructed using irises in a rectangular waveguide formed in a dielectric material such as glass. The filter structure is surface-mountable, has a single dielectric layer, and can be manufactured using a suitable monolithic microwave integrated circuit (MMIC) process. The filter has potential applications in millimeter-wave systems such as Local Multipoint Distribution System (LMDS) and Autonomous Cruise Control (ACC) radar for automobiles.

20 Claims, 6 Drawing Sheets

SURFACE MOUNTABLE MICROWAVE FILTER CONFIGURATION AND METHOD OF FABRICATING SAME

FIELD OF THE INVENTION

The present invention relates to electronics generally, and more specifically to microwave filters.

BACKGROUND OF THE INVENTION

Surface-mount millimeter-wave (mm-wave) and radio frequency (RF) components are highly desirable in terms of reducing the manufacturing costs, increasing the repeatability and increasing the performance. Such components are widely used in today's modern telecommunications systems such as cellular phones and radios. However, they are still not available in high volumes for very high frequency applications such as Local Multipoint Distribution System (LMDS) and Autonomous Cruise Control (ACC) radar for automobiles.

Electrical filters are the basic building blocks that can be found in almost every type of electrical circuitry. Designing of electrical filters has a very well established theory given in the literature. Although there are many ways of implementing the electrical filters, printed microstrip line filters are frequently used in modern RF and millimeter-wave circuits and systems. This is because they are easy to implement, cost-effective, and reproducible through photolithographic techniques. However, making the millimeter-wave printed circuit filters suitable for high-volume manufacturing is a challenge due to the high printing resolution requirements of the filters. In other words, line widths, line lengths, and gaps between the lines of the printed filter should be kept below certain tolerance levels to ensure good performance. The tolerance requirements become more stringent as the frequency increases as one may easily expect. For instance, in order to design a band-pass filter at 77 GHz on a 5-mil thick RT/Duroid 5880 board with relative dielectric constant 2.2 may require the line width and spacing tolerances less than +/−0.0025 centimeters (1 mil). This tolerance requirement may not be feasible for low-cost high-volume manufacturing under current technology although it may be supported for prototype development. If the tolerance requirements on the printed filter are not achieved, the response of the filter deviates from the ideal response that affects the yield of the circuitry. Besides, the microstrip line filters have conductor loss in high frequencies.

In most cases, the high-resolution requirement is needed only at certain sections of the circuitry where the filters are implemented. Therefore, one can make the filter sections as separate blocks and then integrate with the main circuit board using wire-bonds. As a result, the main circuit board can be manufactured with relatively low resolution, which reduces the price of manufacturing, while the filters are being manufactured with high accuracy to comply with the specifications. However, even though this solution may address the accuracy problem, it does not provide a solution to the high conductor losses associated with the microstrip lines. Besides, this approach may complicate the assembly process.

Surface mountable transverse electromagnetic mode (TEM) filters are known in the literature. For instance, U.S. Pat. Nos. 6,060,967, 5,162,760 and 6,064,283 describe examples of surface mountable ceramic filters. In those patents, the filters are constructed in dielectric blocks using appropriate cavities or resonator circuits. The main disadvantage of those structures is that they are complicated and expensive to build because they are not suitable for manufacturing with a monolithic microwave integrated circuit (MMIC) process.

Rectangular waveguides in dielectric substrates are addressed in U.S. Pat. Nos. 6,057,747 and 6,064,350. Those patents employed closely spaced circular vias to form the walls of the waveguide structures, which is disadvantageous at high frequencies due to increased parasitic radiation. However, they did not demonstrate making electrical filters using such structures.

Hence, there is a desire to develop surface-mount millimeter-wave filters in the high frequency range.

SUMMARY OF THE INVENTION

The present invention is a filter comprising a dielectric substrate having a major surface including first and second microstrips at first and second ends of the major surface, respectively. First and second microstrip-to-waveguide mode converters are provided on the major surface. The first and second mode converters are connected to the first and second microstrips, respectively. A waveguide is integrally formed from a portion of the major surface between the first and second mode converters. A plurality of irises project from the major surface.

DETAILED DESCRIPTION

Figure 1:
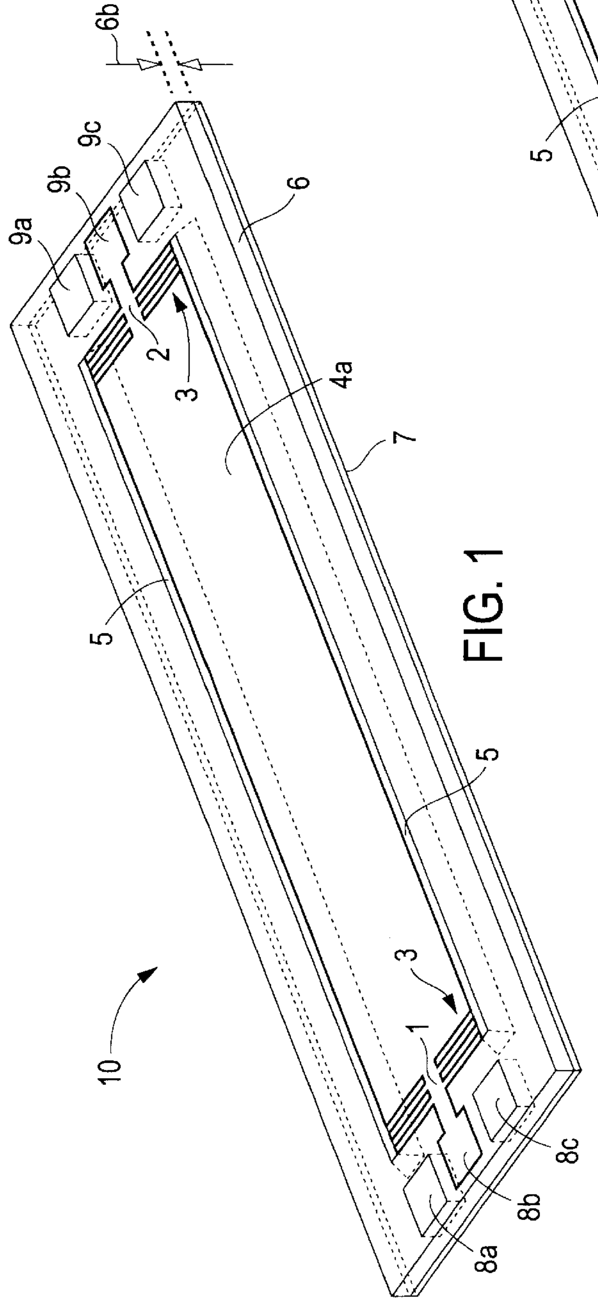
FIG. 1 is an isometric view showing an exemplary dielectric filled rectangular waveguide according to the present invention.
Figure 2A:
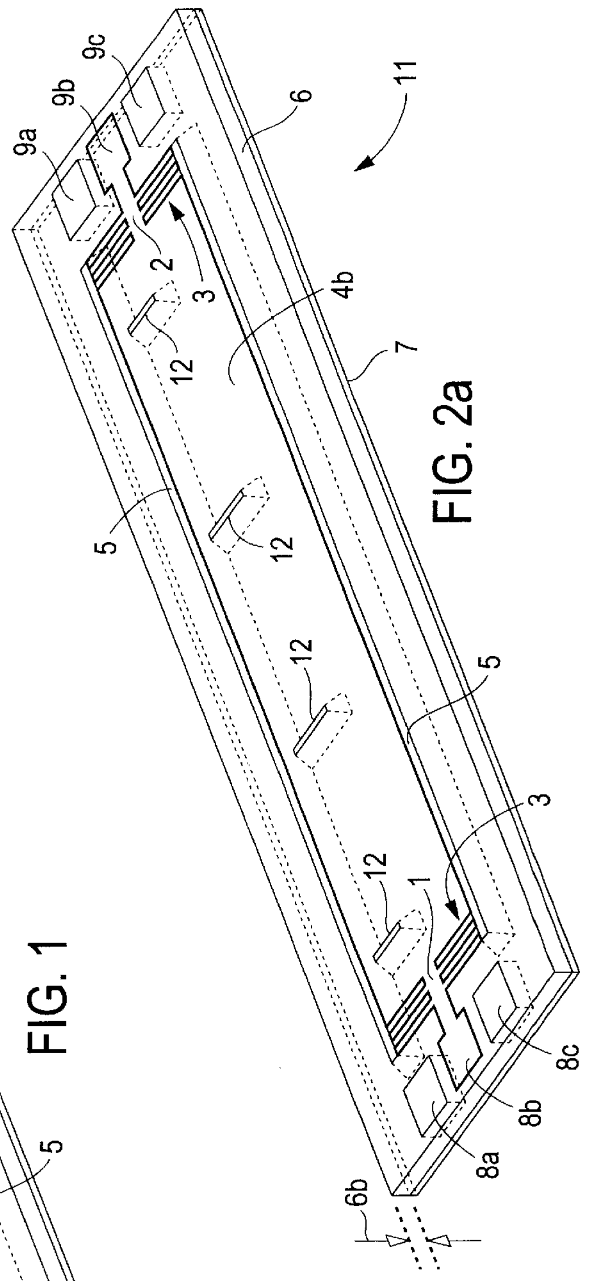
FIG. 2*a* is an isometric view showing an exemplary dielectric filled rectangular waveguide band-pass filter according to the present invention.

One aspect of the design of the exemplary novel band-pass filter includes accurately manufacturing an integrated rectangular waveguide in a MMIC or a printed circuit board (PCB) dielectric and transferring the RF energy from microstrip lines to the rectangular waveguide. FIG. 1 shows a rectangular waveguide formed in this manner employing the microstrip-to-waveguide mode converters 3 to transfer RF energy from microstrip lines 1 to the waveguide 4*a*. This structure is suitable to design band-pass filters by introducing irises 12 in the waveguide 4*b* as shown in FIG. 2A. Note that the resulting filter structure 11 can be wire-bonded or flip-chip mounted on the host PCB depending on the application.

Figure 5:
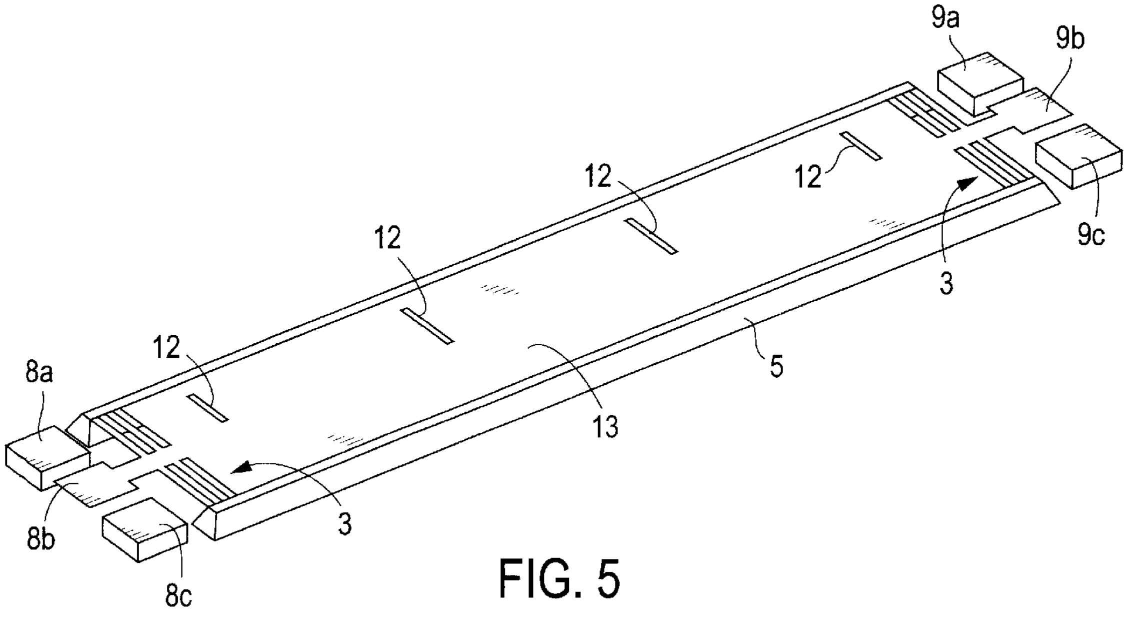
FIG. 5 is an isometric view of only the metalizations for the filter structure shown in FIG. 2A.

The exemplary embodiment includes the following main sections: the input microstrip line 1, the output microstrip line 2, the microstrip-to-waveguide mode converters 3, side-walls constructed using silicon pedestals 5, monolithic microwave integrated circuit (MMIC) substrate 6, and (for the filter 11 of FIG. 2A) irises 12 constructed using silicon pedestals. The rectangular waveguide section 4*a* (or 4*b*) has two walls on its sides formed by the pedestals 5. The top side of the dielectric waveguide 4*a* (or 4*b*) is metallized to form the top wall of the waveguide 13. This metalization covers the top surface of the dielectric, which resides between the sidewalls 5 and microstrip-to-waveguide mode converters 3 as shown in FIG. 5. The bottom side of the MMIC substrate 6 is also metalized to form the ground plane 7 and bottom wall of the waveguide.

Figure 2B:
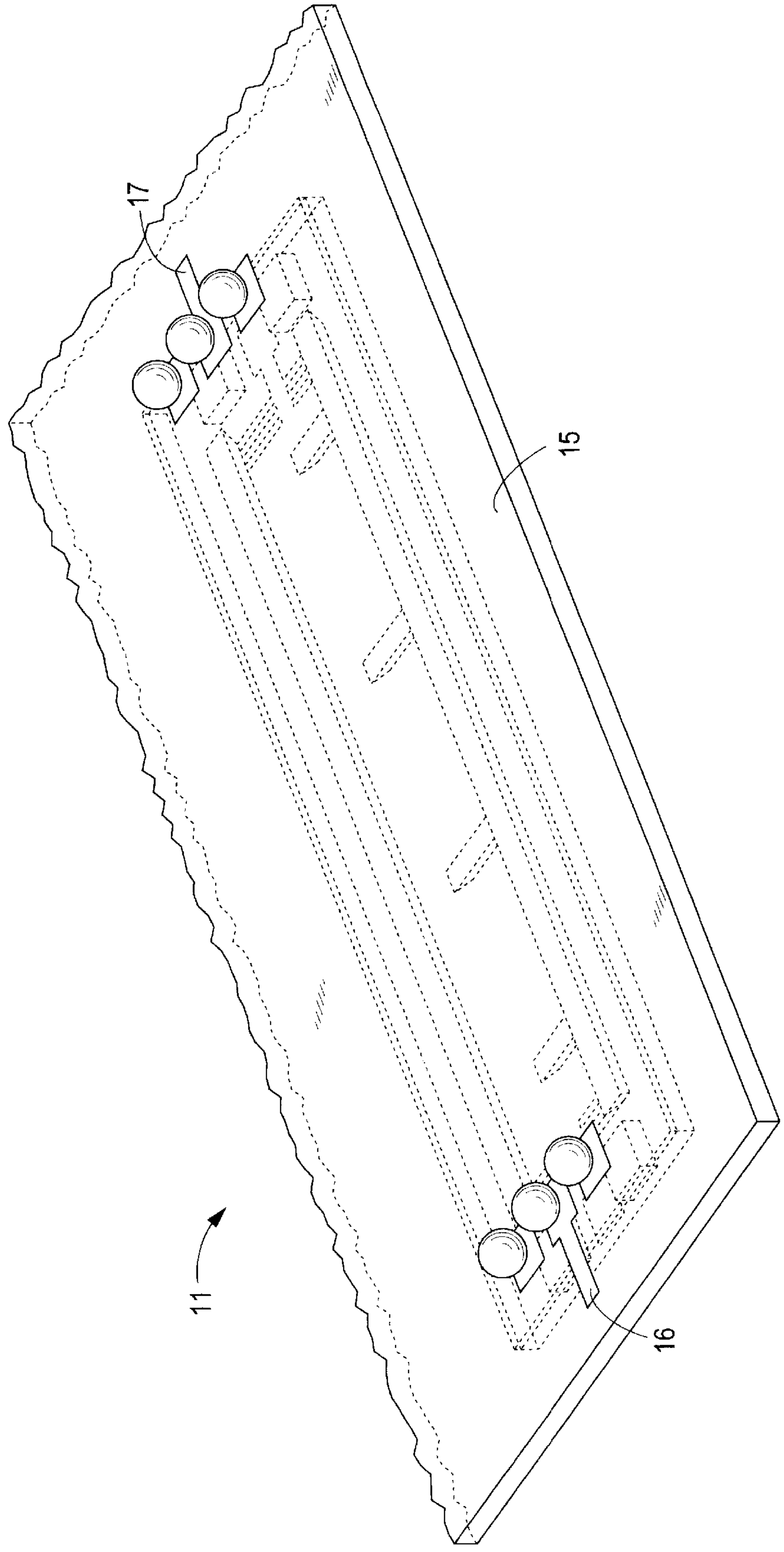
FIG. 2*b* is an isometric view of a printed circuit board on which the filter of FIG. 2*a* is flip-chip mounted.
Figure 3:
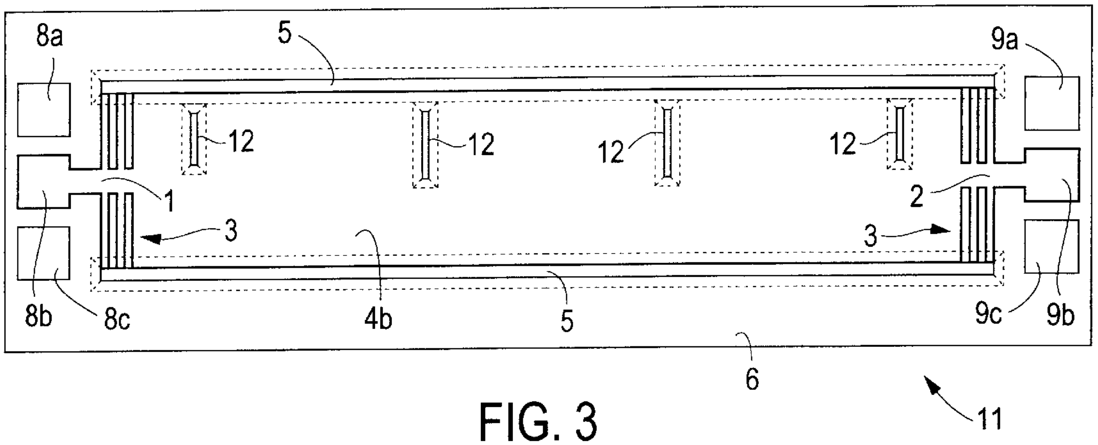
FIG. 3 is the plan view showing an exemplary dielectric filled rectangular waveguide band-pass filter according to the present invention.

The band-pass filter 11 (FIG. 2A) is constructed using iris coupled rectangular waveguide cavities formed in a MMIC substrate 6. Note that, although a MMIC substrate 6 is used in the example of FIG. 2A, the technique is also applicable to PCB substrates as long as the process employed can manufacture continuous metallic pedestals. The input and the output of the waveguide 4*a* (and filter 4*b*) are transferred to the input microstrip 1 and output microstrip 2 by using the waveguide-to-microstrip mode converters 3 of a type disclosed in U.S. Pat. No. 6,087,907, which is incorporated by reference herein in its entirety. By implementing the input and output of the filter 11 as microstrip lines 1 and 2, the filter block 11 can be flip-chip mounted on a host circuit board 15 (as shown in FIG. 2*b*) using the pads 8*a*, 8*b*, 8*c*, 9*a*, 9*b*, and 9*c*. Alternatively, wire bonding could also be used to connect the filter to the host circuit board. In the case of flip-chip mounting, the pads 8*b* and 9*b* are used for signal and are connected to microstrip lines 16 and 17 on the host PCB 15, while pads 8*a*, 8*c*, 9*a*, 9*c* are used for ground connections. In case of wire-bond mounting (not shown), one can only use the pads 8*b* and 9*b* for the signal connections provided that the ground of the filter is connected to the ground of the host circuit board. Note that wire bonding could introduce significant series inductance at mm-wave frequencies. However, one of ordinary skill in the art can readily compensate these parasitic inductances for lower reflection loss. Use of the waveguide-to-microstrip mode converter 3 makes it easy to design a one-layer broadband transition, which is especially important to have a one-layer circuit structure. The mode converter 3 allows one to make compact filters. Further, the filter 11 described herein can have a very low loss provided that the dielectric of the MMIC substrate has low loss.

The exemplary embodiment includes metallic waveguide structures 5 and 12 on an MMIC substrate 6 using continuous rectangular pedestals. The filter 11 is designed using standard rectangular waveguide filter synthesize techniques. Note that filter 11 is a non-TEM filter; the dominant $TE_{10}$ propagation mode of a rectangular waveguide is used. Further, the filter 11 can be manufactured using an MMIC process that makes it extremely cost effective. In addition, because the MMIC processes use photolithographic techniques to etch the circuit structure, the filter has extremely high dimensional precision, which is another advantage.

The exemplary waveguide section 4*a* and filter 4*b* include continuous rectangular pedestals 5 to form the waveguide walls, which are superior in performance to closely spaced circular vias that can alternatively be used in other waveguide devices (not shown). Note that using closely spaced circular vias are an approximation to a continuous conductive wall 5. The exemplary continuous pedestal design for side walls 5 provides better performance than a filter having many closely spaced circular vias; the continuous pedestal design eliminates spurious responses due to cross-coupling and leakage that are otherwise possible with the circular vias. In addition to that, the exemplary transition 3, which transfers electromagnetic energy from the rectangular waveguide 4*a* (or 4*b*) to the microstrip medium 1 and 2 makes the filter block 11 extremely suitable for surface mounting on a host PCB as explained above.

The dielectric substrate for filter 11 may be fabricated using a Glass MMIC process by the M/A-COM unit of Tyco Electronics in Lowell, Mass., and described in U.S. Pat. No. 6,150,197, which is incorporated by reference herein in its entirety. Although the steps of this process are given in the literature, it is beneficiary to the reader if the main steps of the process are reviewed here briefly. The first step in this process is to etch an appropriate silicon wafer to form the required pedestals 5, 12 according to the shape of the filter 4*b* (i.e., form the waveguide walls 5 and irises 12). Depending on the filter order, center frequency, and bandwidth, the number and openings of the irises change. One of ordinary skill can readily determine dimensions and positions of the irises for a given filter transfer function. The silicon wafer will be used to define the pedestals 5, 12 and the ground plane 7. Note that only a portion of the silicon wafer constituting a substrate 6 for a single die is shown in FIGS. 1 and 2. It is understood that a single wafer may have many such dies formed thereon.

In the exemplary waveguides 4*a* and 4*b* of FIGS. 1 and 2, the filter walls 5 and the irises 12 are all implemented as silicon pedestals, rather than trenches or vias with metallized walls. The pedestals 5 and the irises 12 form the shape of the sidewalls and the resonator sections 12 of the rectangular waveguide 4*b*, respectively. Then, the surface of the etched silicon is coated with silver (or other appropriate metal) to increase the conductivity. After this step, a layer of glass is formed, either by pressing a glass wafer down on the silicon wafer, or by depositing glass powder and firing the glass, as described further below. The glass is used as the dielectric material of the substrate. Then, the top of the glass is lapped and polished until the top surfaces of the pedestals 5, 12 are exposed. Finally, the top metallization is deposited over the glass and patterned, and the dies 10, 11 are cut from the wafer with appropriate tools.

In the filter structure 11, the pedestals 5 and 12 should ideally intersect each other with right angles. In order to completely fill the corners of.these angles, the glass can be deposited as a powder and fired to form a homogenous glass layer.

Alternatively, a glass wafer may be pressed down on to the etched silicon under high temperature and high pressure. As a result, the glass fills all the spaces but the volume occupied by pedestals 5 and 12, creating a continuous dielectric filling. If wafer glass is used instead of powder glass, then the corners (where the walls 5 and irises 12 intersect) may not be filled completely when the glass wafer is pressed down, resulting in void formation at the intersections. In that case, small gaps are preferably provided at the intersection between the two pedestals 5 and 12, to release the pressure. Note that these small gaps, if included, should be accounted in designing the filter irises 12.

Note that, although glass is used as an exemplary substrate material, the technique described herein can also be practiced with any other substrate materials (Ceramics, for example) as long as the process for forming the substrate has the capability of implementing continuous pedestals in the dielectric.

However, for most simple substrate technologies, it would be very difficult to provide continuous vias/trenches in a process that manufactures many filters 4*b* and/or waveguides 4*a* on the same substrate 6. If one were to cut a via trench around the whole structure, there would be no substrate material left to attach it to the next part in the array. Even with the intersections not joined, it would be an extremely fragile substrate to process.

Also, by using the M/A-COM's Glass MMIC process described above, one could build more than one filter structure 11 in a single glass piece; thanks to the silicon pedestal technology.

The exemplary substrate material, 6, is glass having the dielectric constant of 4.0 and the thickness 6*b* of 125 microns. The loss tangent of the exemplary glass at the millimeter-wave frequencies is approximately 0.002. Alternatively, glass having a different thickness can be used for an appropriate device.

Figure 6:
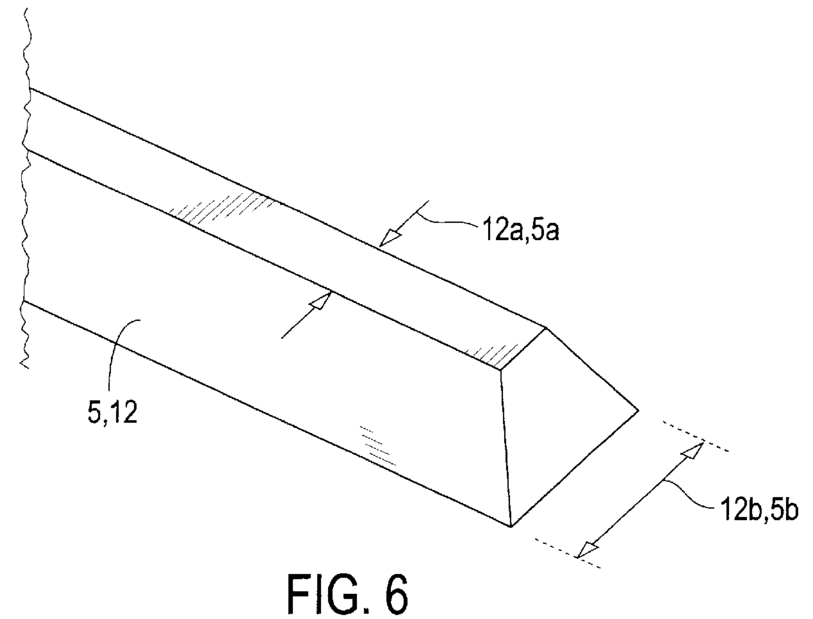
FIG. 6 is an enlarged detail of one of the silicon pedestals.

The walls 5 and irises 12 are constructed by using the silicon pedestals as described above. The shape of the walls 5 and irises 12 is not exactly a rectangular prism but has a trapezoidal profile, as best seen in FIG. 6. This is due to the MMIC manufacturing process used to etch the substrate 6. The tops of the pedestals 5, 12 touch the top metallization of the waveguide 4*a* and 4*b*. The widths 5*a* at the top of the sidewall pedestals 5 may be, for example, 127 microns, and the widths 12*a* at the top of the iris pedestal walls 12 may be, for example, 50 microns. The widths 5*b* at the bottom of the sidewall pedestals may be, for example, 320 microns, and the widths 12*b* at the bottom of the iris pedestals may be, for example, 240 microns. One of ordinary skill can readily determine dimensions for specific waveguide and filter applications.

Determination of the position and length of the irises 12 is done using standard design techniques. However, since the standard techniques assume idealized conditions (e.g., rectangular irises), optimization based on full-wave electromagnetic simulations is necessary after the initial design, as understood by one of ordinary skill in the art.

Figure 4:
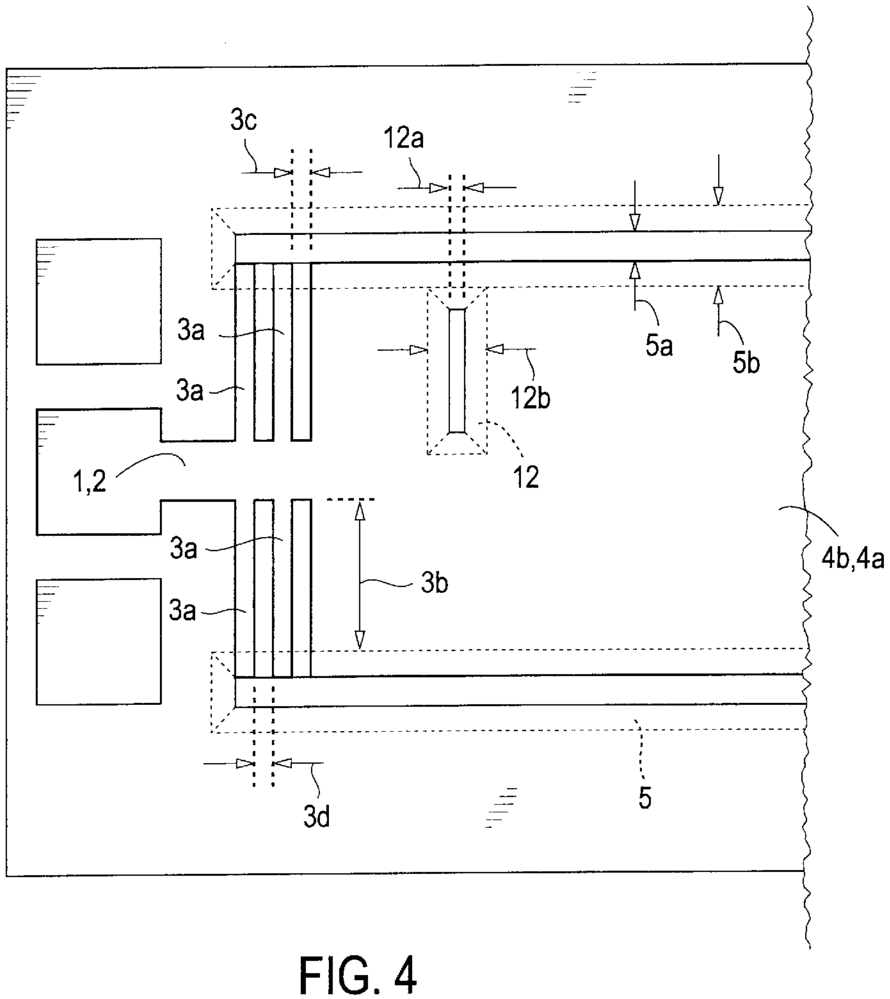
FIG. 4 is an enlarged plan view of an exemplary microstrip-to-waveguide mode converter suitable for use in the filter of FIG. 2A and an exemplary iris section.

Reference is now made to FIG. 4, which is an enlarged plan view of a microstrip-to-waveguide mode converter 3. The operation of the structure can be explained as follows: The quasi-TEM electrical signal carried by the input microstrip line 1 is transferred to the $TE_{10}$ mode of the rectangular waveguide formed in the dielectric substrate 4*a* (or 4*b*) by the mode converter (microstrip-to-waveguide transition) 3. The fingers 3*a* in the mode converter 3 improve the reflection loss at the operating frequency. The lengths 3*b* of the fingers 3*a* are approximately quarter wavelength long at the operating frequency. The finger widths 3*c*, lengths 3*b*, and separations 3*d* are optimized using a full-wave electromagnetic simulation tool. At the opposite side of the structure, the signal is again transferred to quasi-TEM mode by another mode converter 3. The microstrip input 1 and output 2 make the filter 4*b* extremely suitable for surface mounting on the host PCB using flip-chip techniques. To mount the filter structure as flip chip, the solder bumps should be placed on the pads 8*a*, 8*b*, 8*c*, 9*a*, 9*b*, and 9*c* as explained above.

Figure 7A:
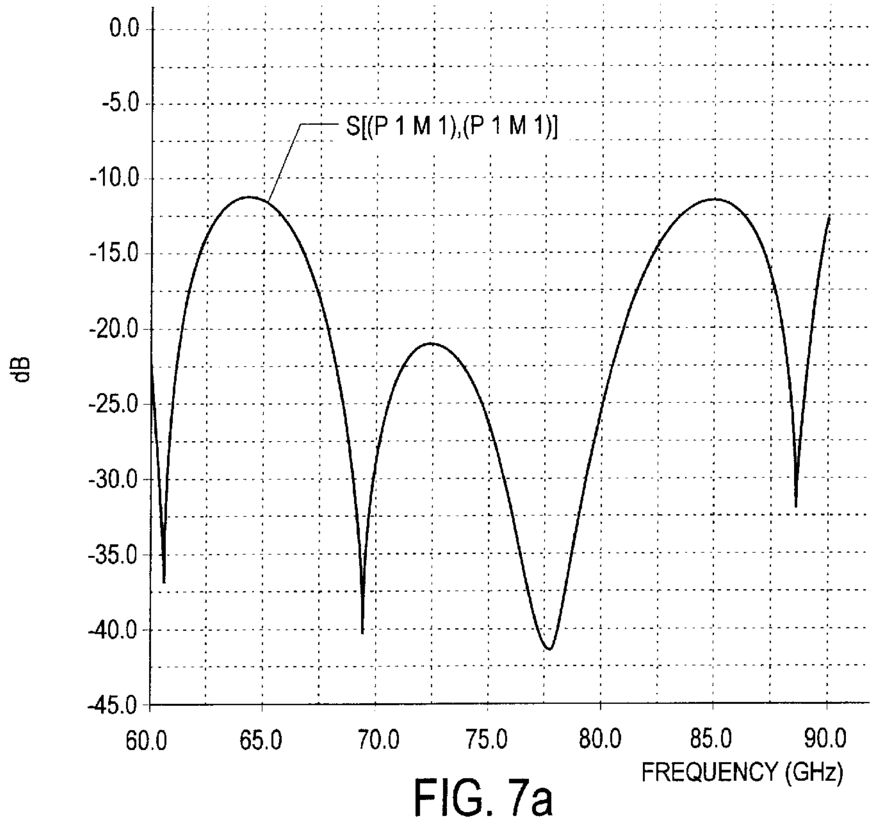
FIGS. 7*a* and 7*b* are the return and insertion losses, respectively, of the rectangular waveguide shown in FIG. 1.
Figure 7B:
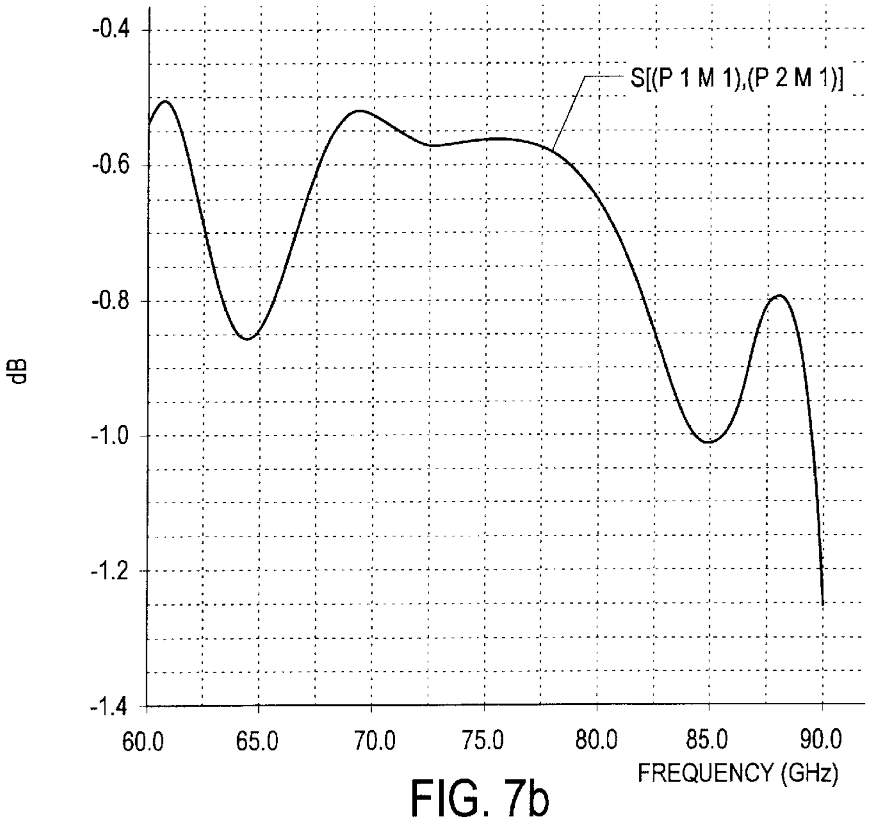

The simulated response of a straight rectangular waveguide formed in the glass substrate is shown in FIGS. 7*a* and 7*a*. FIG. 7*a* shows the reflection loss, and FIG. 7*b* shows the insertion loss. The microstrip-to-waveguide mode converters are optimized at 75–80 GHz; therefore, the performance is optimum around that region. More specifically, the exemplary waveguide is optimized at 77 GHz.

Figure 8A:
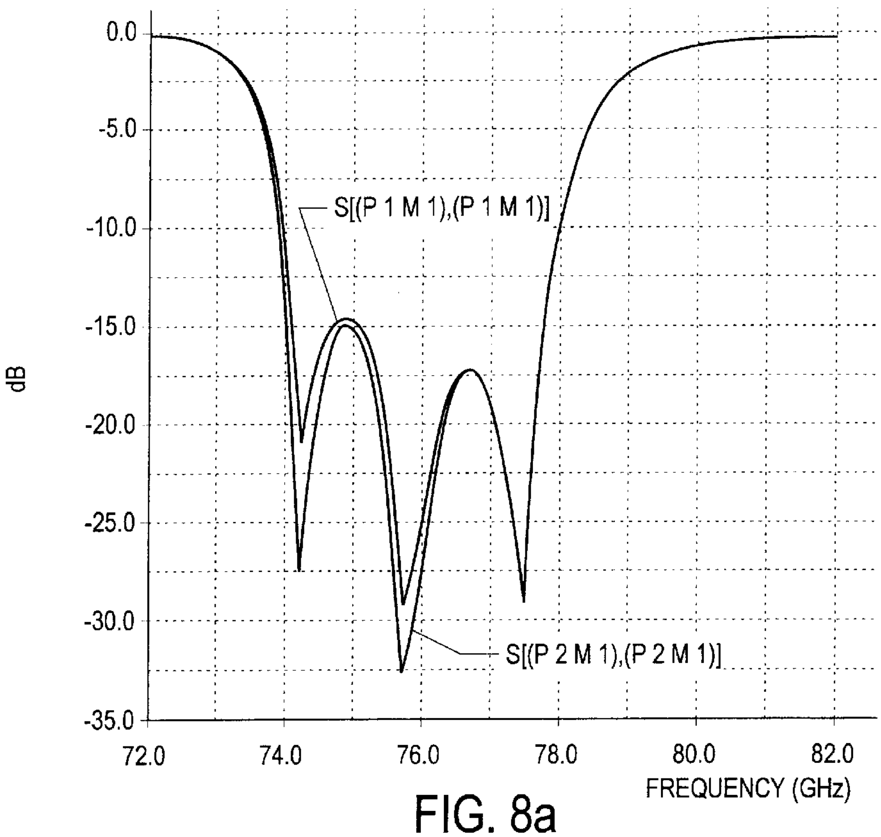
FIG. 8*a* and 8*b* are the return and insertion losses, respectively, of the band-pass filter shown in FIG. 2A.
Figure 8B:
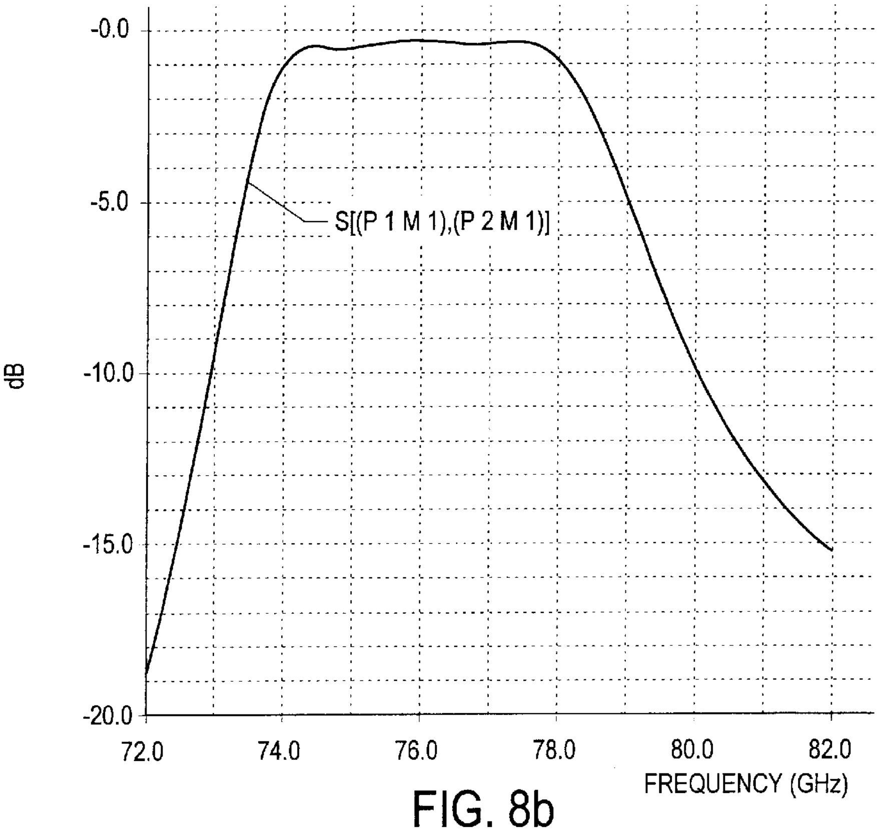

FIGS. 8*a* and 8*a* show the simulated response of the 76 GHz band-pass filter shown in FIG. 2A. FIG. 8*a* shows the reflection loss, and FIG. 8*b* shows the insertion loss. The 3-dB bandwidth of this filter is approximately 5 GHz and centered at 76 GHz.

FIG. 9 is a flow chart diagram showing a method for forming a filter described above. At step 1000, pedestals by etching the substrate 6, to form the side walls 5 and irises 7 of the filter. At step 1002, the top surface of the substrate (including the side walls 5 and irises 7 is covered with metal.

At step 1004, one of the glass application methods is used. If the glass powder method is used, then at step 1010, glass powder is deposited on the substrate, and at step 1012 the glass is fired, to form a conformal layer.

If the glass wafer method is used, then at step 1006, a glass wafer is placed on top of the substrate. At step 1008, heat and pressure are applied so that the glass wafer is molded to fit the substrate. For a good conformal coating, it is preferred that small gaps are provided in the pedestals where the irises 12 meet the side walls 5.

At step 1014, the glass is polished to expose the tops of the irises 7. Then at step 1016, the polished top surface is metallized.

Although the invention has been described in terms of exemplary embodiments, it is not limited thereto. Rather, the appended claim should be construed broadly, to include other variants and embodiments of the invention, which may be made by those skilled in the art without departing from the scope and range of equivalents of the invention.

What is claimed is:

1. A filter, comprising:

a dielectric substrate having a major surface including first and second microstrips at first and second ends of the major surface, respectively, first and second microstrip-to-waveguide mode converters on the major surface, the first and second mode converters connected to the first and second microstrips, respectively;

a waveguide integrally formed from a portion of the major surface between the first and second mode converters; and a plurality of irises projecting from the major surface.

2. The filter of claim 1, wherein each mode converter includes a plurality of fingers extending in a direction transverse to a direction of signal propagation of the waveguide.

3. The filter of claim 1, wherein the plurality of fingers in each mode converter includes two set of fingers extending in opposite directions.

4. The filter of claim 1, wherein the waveguide has a pair of longitudinal walls symmetrically arranged about a line segment connecting the first and second microstrips.

5. The filter of claim 4, wherein the longitudinal walls are formed by pedestals integrally formed on a surface of the substrate.

6. The filter of claim 4, wherein the irises are formed by pedestals integrally formed on a surface of the substrate.

7. The filter of claim 6, wherein each iris has a trapezoidal cross section.

8. The filter of claim 1, wherein the substrate is formed of a material from the group consisting of glass and a ceramic.

9. The filter of claim 1, further comprising a conformal layer of glass over the substrate, mode converters, and waveguide.

10. A printed circuit board assembly, comprising:

a circuit board substrate having a plurality of printed wirings thereon; and a filter mounted on the circuit board substrate, comprising:

a dielectric substrate having a major surface including first and second microstrips at first and second ends of the major surface, respectively, first and second microstrip-to-waveguide mode converters on the major surface, the first and second mode converters connected to the first and second microstrips, respectively;

a waveguide integrally formed from a portion of the major surface between the first and second mode converters; and a plurality of irises projecting from the major surface.

11. The printed circuit board of claim 10, wherein the filter is flip-chip mounted to the circuit board substrate.

12. A method for fabricating a filter, comprising:

(a) forming first and second microstrips and first and second microstrip-to-waveguide mode converters at respective first and second ends of a major surface of a dielectric substrate, (b) forming side walls that define a waveguide on the major surface between the first and second mode converters; and (c) forming a plurality of irises projecting from the major surface between the first and second mode converters.

13. The method of claim 12, wherein step (a) includes plating a plurality of fingers on the substrate, the fingers being normal to the microstrips and terminating at the microstrips.

14. The method of claim 12, wherein step (b) includes forming a plurality of continuous pedestals connecting the first and second mode converters.

15. The method of claim 12, wherein step (c) includes forming pedestals projecting from the major surface of the substrate.

16. The method of claim 15, wherein step (c) includes etching the major surface of the substrate, so that the pedestals remain.

17. The method of claim 12, further comprising placing a conformal layer of glass on the substrate, microstrips, waveguide and irises.

18. The method of claim 17, wherein the glass layer is formed by pressing a glass wafer on to the substrate, microstrips, waveguide and irises at an elevated temperature and pressure.

19. The method of claim 17, wherein the glass layer is formed by:

depositing glass powder on the substrate, microstrips, waveguide and irises; and firing the glass powder.

20. The method of claim 17, further comprising polishing the glass until top surfaces of the irises are exposed.

* * * * *